United States Patent
Rhodes

(10) Patent No.: US 7,253,020 B2
(45) Date of Patent: Aug. 7, 2007

(54) DEUTERIUM ALLOY PROCESS FOR IMAGE SENSORS

(75) Inventor: Howard E. Rhodes, Boise, ID (US)

(73) Assignee: Omnivision Technologies, Inc, Sunnyvale, CA (US)

( * ) Notice: Subject to any disclaimer, the term of this patent is extended or adjusted under 35 U.S.C. 154(b) by 0 days.

(21) Appl. No.: 11/029,704

(22) Filed: Jan. 4, 2005

(65) Prior Publication Data
US 2006/0148120 A1 Jul. 6, 2006

(51) Int. Cl.
H01L 21/00 (2006.01)
(52) U.S. Cl. .................... 438/64; 438/73; 257/E27.133
(58) Field of Classification Search ................. 438/64, 438/66, 73; 257/E27.133
See application file for complete search history.

(56) References Cited

U.S. PATENT DOCUMENTS 6,187,665 B1 * 2/2001 Chetlur et al. .............. 438/627
6,576,522 B2 * 6/2003 Chetlur et al. .............. 438/359
2002/0031920 A1 * 3/2002 Lyding et al. .............. 438/795

FOREIGN PATENT DOCUMENTS

| TW | 419745 | 1/2001 |
|---|---|---|
| TW | 511164 | 11/2002 |

* cited by examiner

Primary Examiner—Trung Dang
(74) Attorney, Agent, or Firm—Blakely Sokoloff Taylor & Zafman LLP

(57) ABSTRACT

A method of alloying an image sensor is disclosed. The method comprises forming various semiconductor devices in a semiconductor substrate. Then, an insulator layer is formed over the semiconductor devices. Finally, deuterium gas is used to alloy said image sensor after the insulator oxide layer has been formed and prior to formation of contact holes in the insulator oxide layer.

8 Claims, 3 Drawing Sheets

DEUTERIUM ALLOY PROCESS FOR IMAGE SENSORS

TECHNICAL FIELD

The present invention relates to image sensors, and more particularly, to an image sensor that uses an improved deuterium (D2) alloy process.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

One common issue in image sensors, either of the CMOS or CCD type, is channel hot carrier (CHC) reliability. In order to resolve this issue, a heat treatment, such as an alloying process has been developed in the prior art. The purpose of the allowing process is to satisfy any "dangling" silicon bonds at the silicon/silicon dioxide interface underneath transistor gates. Hydrogen atoms are formed as part of the alloy process and these hydrogen atoms satisfy the dangling silicon bond and eliminate surface state traps and improve transistor performance.

During this alloying process, the semiconductor wafers are typically exposed to a combination of nitrogen ($N_2$) and hydrogen ($H_2$) gases in a furnace at a temperature of around 400-450 C. This process is performed as part of a passivation process or after etching of the bond pads of the image sensor. However, at this juncture of the manufacturing process, the metal layers of the image sensor have already been defined and patterned. The metal layers are typically detrimentally affected by temperatures greater than 400-450° C.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
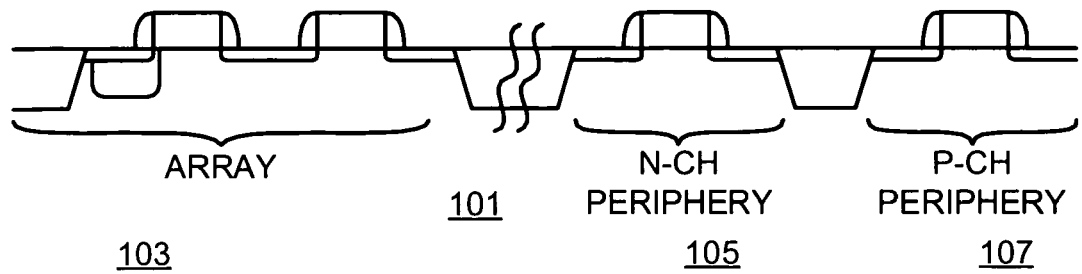
FIG. 1 is a cross-sectional view of a prior art image sensor having an array section, a peripheral p-channel section, and a peripheral n-channel section.

FIG. 1 shows a cross-sectional view of a prior art image sensor. As seen in FIG. 1, a portion 101 of an image sensor is shown. The portion 101 of the image sensor includes a pixel array section 103, an n-channel periphery area 105, and a p-channel periphery area 107. The n-channel periphery area 105 and p-channel periphery area 107 contains those elements of the image sensor outside of the pixel array 103. As is known by those in the art, the periphery areas 105 and 107 are used to form various control, logic, signal processing, readout, and other types of integrated circuitry. The transistors shown in areas 105 and 107 of course are merely exemplar and these areas would normally contain many transistors (PMOS and NMOS). Likewise, the pixel array section 103 only shows one example of a pixel, and is meant to be representative of a pixel array. For example, the pixel array would include photosensitive elements, such as those chosen from the group of a photodiode, partially pinned photodiode, pinned photodiode, photogate, or photocapacitor.

As can be appreciated by those skilled in the art, after the semiconductor devices and implanted regions have been formed in the semiconductor substrate and on top of the substrate, various interconnect structures must be formed over the image sensor. For example, turning to FIG. 2, typically an insulating oxide layer 201 is blanket deposited over the surface of the image sensor. The insulator may be spin on glass (SOG), borophosphosilicate glass (BPSG), phosphosilicate glass (PSG), or undoped silicate glass (USG).

In accordance with the present invention, at this juncture in the manufacturing process, the image sensor is alloyed using deuterium gas, which is a naturally occurring isotope of hydrogen. Note that this alloying process takes places prior to the deposition and etching of any metal layers and thus, does not deteriorate the metal layers. Under hot electron degradation, high energy (hot) electrons can impact the surface and dislodge hydrogen atoms (from conventional prior art alloying) and re-create surface state traps. The deuterium isotope of hydrogen is twice as heavy as hydrogen, and it is believed that the deuterium is much more difficult for the hot electrons to dislodge. For this or whatever physical reason, the hot electron lifetime under hot electron stress conditions (low temperature, high voltage stress) can be improved using a deuterium alloy.

Figure 2:
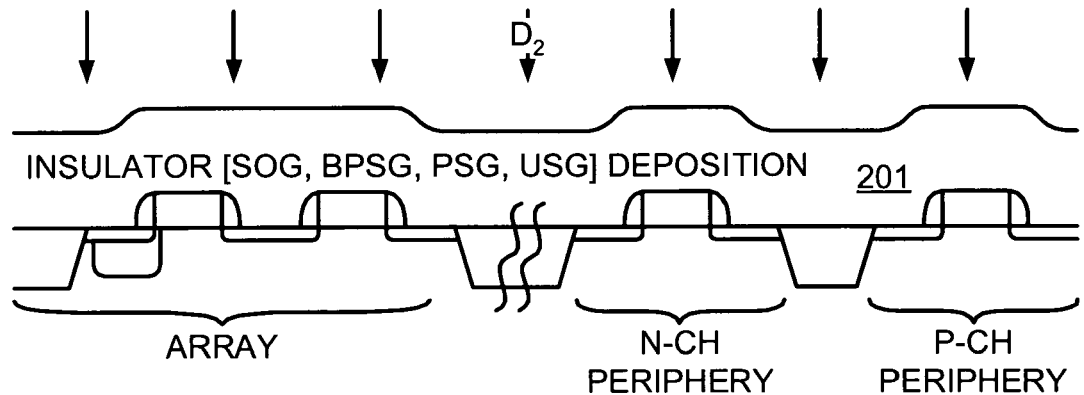
FIGS. 2-5 are cross-sectional diagrams showing the use of deuterium alloying in accordance with the present invention.

Thus, as seen in FIG. 2, the alloying process using the deuterium is performed after deposition of the blanket insulator layer over the semiconductor substrate and transistor gates. The alloying process typically takes place in a furnace tube. In one embodiment, the alloying process takes place under one atmospheric pressure with a 5% deuterium mix in nitrogen to a 100% deuterium mix in the ambient. The temperature is in the range of 300-900° C., and preferably between 500-800° C.

Figure 3:
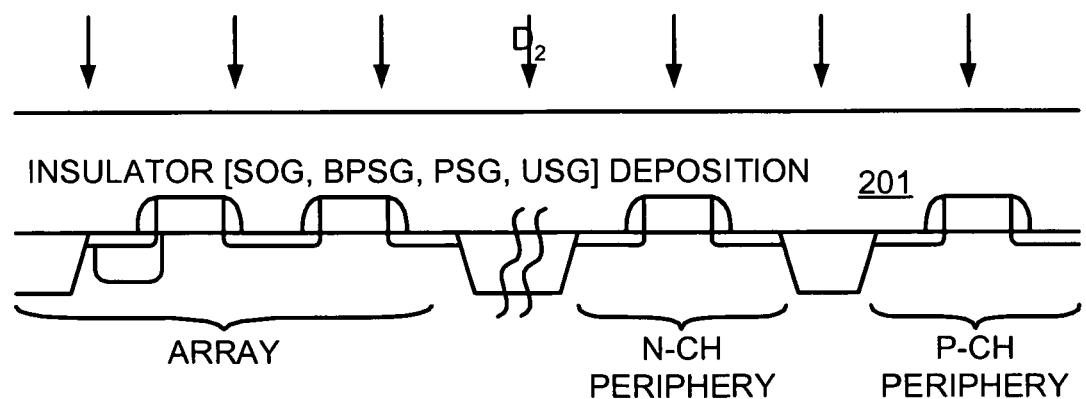

In an alternative embodiment shown in FIG. 2, the deuterium alloying process is performed after planerization of the insulator oxide layer 201. As seen in FIG. 3, the insulator layer 201 has been planerized to remove irregularities in the topology of the oxide. The planarization step is a common step used to aid in the manufacturing process and can be performed using a chemical mechanical polishing (CMP) or an etching back process.

Figure 4:
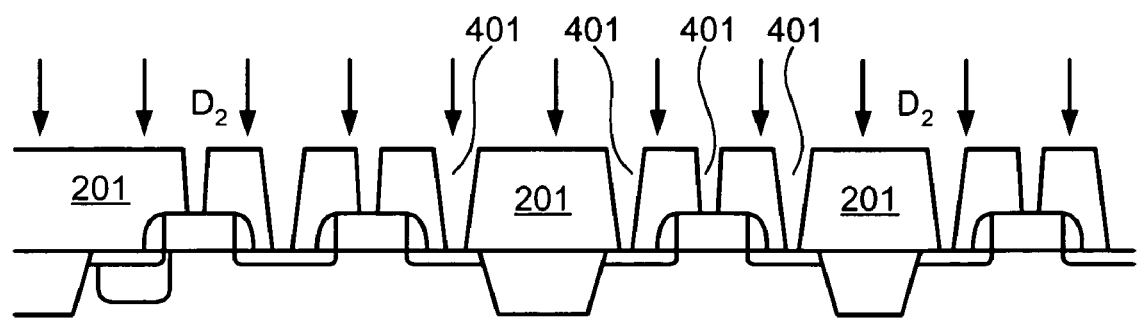

In yet another alternative embodiment shown in FIG. 4, the deuterium alloying process is performed after openings have been made in the insulator layer 201. The openings 401 are typically made in order to allow contact plugs to be formed in the insulator layer that contact various active regions in the substrate or to contact the polysilicon gates of the transistors. Thus, in FIG. 4, the openings 401 will eventually be filled with contact plugs. In the embodiment shown in FIG. 4, the deuterium alloying process is performed after the masking and etching of the insulator oxide layer 201.

Figure 5:
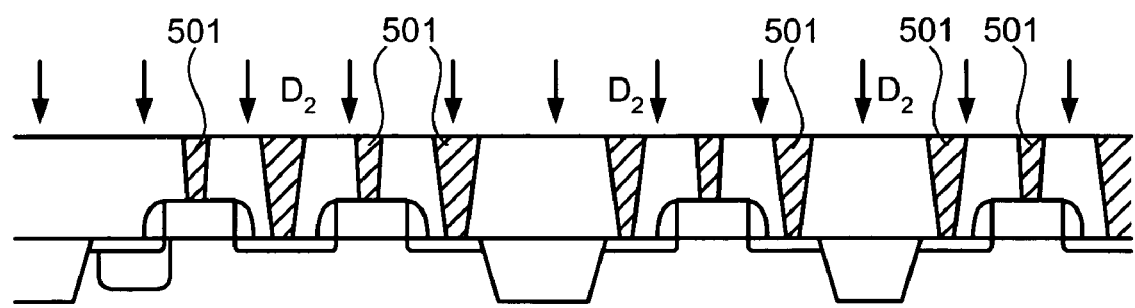

Still alternatively, as seen in FIG. 5, once contact plugs 501 have been formed in the openings for 401, the deuterium alloying process may be performed. In all the embodiments described above, the deuterium alloying is performed prior to deposition of the metal layer for formation of the interconnect. This is an advantage over the prior art which results in deterioration of the metal interconnect layer.

Figure 6:
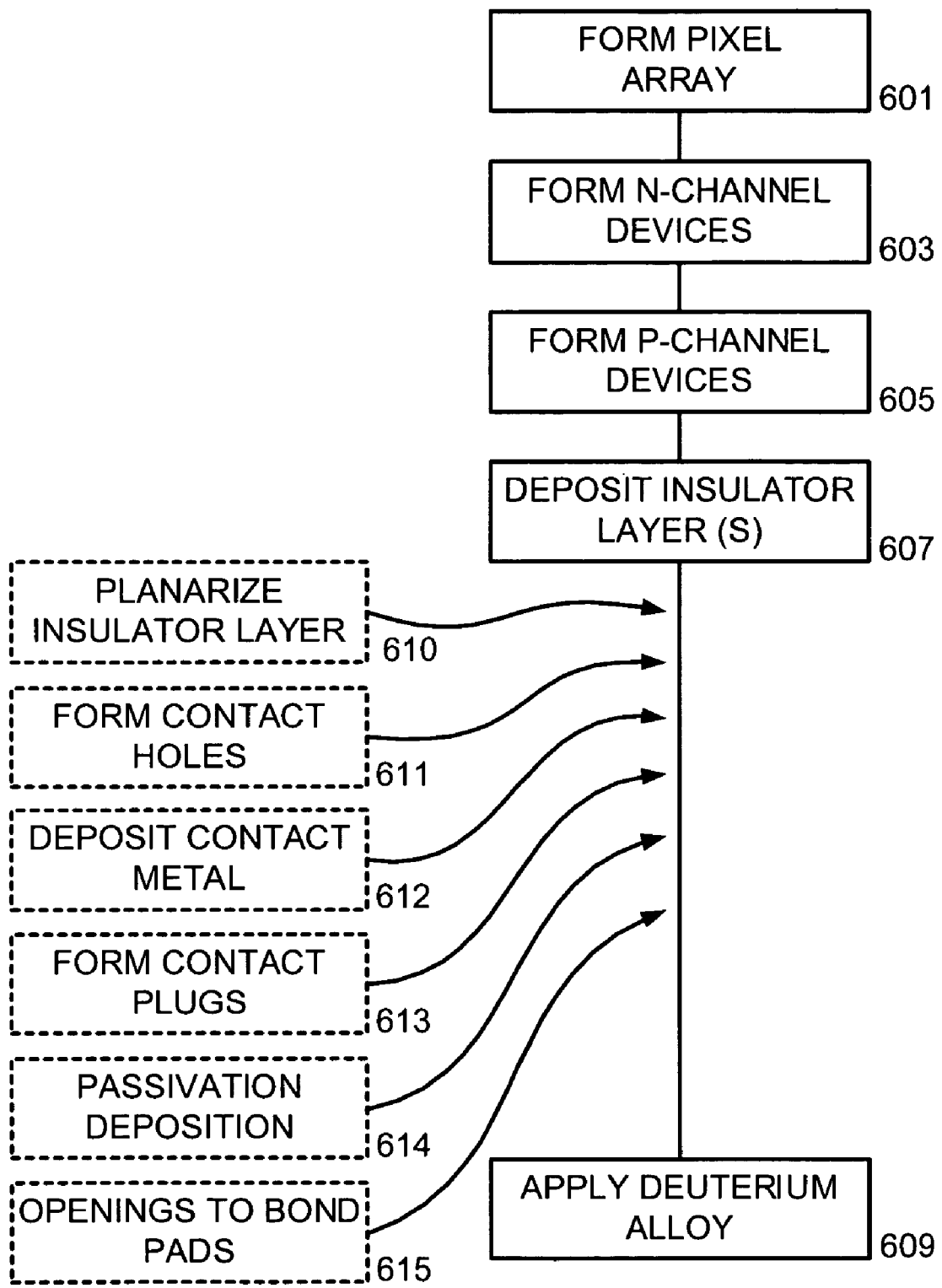
FIG. 6 is a flow diagram illustrating a method in accordance with the present invention.

FIG. 6 illustrates in flow diagram a method of the present invention. First at a box 601, a pixel array is formed in a semiconductor substrate. Then, at a box 603, semiconductor devices, such as transistors, memory, capacitors, etc. . . . are formed in the n-channel periphery area 105. Then, at box 605, semiconductor devices, such as transistors, memory, capacitors, etc. . . . are formed in the p-channel periphery area 107. Note that in most embodiments, the pixel array and semiconductor devices in the areas 105 and 107 are formed during the same sequence of manufacturing steps and thus are formed in parallel. However, for the purposes of this description, for ease of understanding, boxes 601, 603, and 605 describe three different steps. Thus, in most practical applications, the pixel array is not formed prior to forming of the n-channel or p-channel devices.

Next, at box 607, insulator layer 201 is deposited over the pixel array and semiconductor devices formed in boxes 601, 603, and 605. Then, at box 609, the deuterium alloy process is performed. Alternatively, a series of additional process steps (shown in dashed boxes) may be added prior to the deuterium alloy process. For example, at box 610, the insulator layer may be planarized prior to the deuterium alloy process. As a further example, at box 611, the contact holes may be formed in the insulator oxide layer 201 prior to the deuterium alloy process. Alternatively, the contact metal may be deposited at box 612 prior to the deuterium alloy step. Still further alternatively, at box 613, contact plugs may be formed in the vias and contact holes prior to the deuterium alloy step.

After these steps, a typical process may also include multiple layers of metallization deposition and via formation. In one embodiment, three metal layers are deposited, patterned, etched, and vias formed. After this process, a passivation layer is deposited at box 614. The deuterium alloy process of box 609 may be performed after this step. Further, openings through the passivation layer to the bond pads may be formed at box 615. The deuterium alloy process of box 609 may be performed after this step.

Thus, from the foregoing, it will be appreciated that specific embodiments of the invention have been described herein for purposes of illustration, but that various modifications may be made without deviating from the spirit and scope of the invention. Note that to the extent that surface states and interface states contribute to imager dark current, then the dark current may also be improved by the use of the present invention. Accordingly, the invention is not limited except as by the appended claims.

I claim:

1. In a method of manufacturing a CMOS image sensor, a method of alloying the CMOS image sensor comprising:
    forming a pixel array in a semiconductor substrate, said pixel array formed from photodiodes;
    forming semiconductor devices in an n-channel periphery area;
    forming semiconductor devices in a p-channel periphery area;
    forming an insulator layer over said photodiodes and semiconductor devices;
    thereafter, planarizing the formed insulator layer over said photodiodes and semiconductor devices; and
    thereafter, using deuterium gas to alloy said image sensor in an atmosphere having generally less than 100% of deuterium after said insulator oxide layer has been formed and planarized and prior to formation of contact holes in said insulator oxide layer, wherein the deuterium gas has a partial pressure of less then one atmospheric pressure.

2. The method of claim 1 wherein said deuterium alloy is performed in a deuterium and nitrogen atmosphere with deuterium being about 5% of the atmosphere and temperature between 300 to 900° C.

3. In a process for manufacturing a CMOS image sensor, a method of alloying the CMOS image sensor comprising:
    forming a pixel array in a semiconductor substrate, said pixel array formed from photodiodes;
    forming semiconductor devices in an n-channel periphery area;
    forming semiconductor devices in a p-channel periphery area;
    forming an insulator layer over said photodiodes and semiconductor devices;
    forming contact holes in said insulator layer; and
    thereafter, using deuterium gas to alloy said image sensor in an atmosphere having generally less than 100% of deuterium after said insulator oxide layer has been formed and prior to formation of contact plugs in said contact holes, wherein the deuterium gas has a partial pressure of less then one atmospheric pressure.

4. The method of claim 3 wherein said deuterium alloy is performed in a deuterium and nitrogen atmosphere with deuterium being about 5% of the atmosphere and temperature between 300 to 900° C.

5. A method of alloying an image sensor comprising:
    forming a pixel array in a semiconductor substrate;
    forming semiconductor devices in an n-channel periphery area;
    forming semiconductor devices in a p-channel periphery area;
    forming an insulator layer over said pixel array and semiconductor devices;
    forming contact holes in said insulator layer;
    forming contact plugs in said contact holes; and
    thereafter, using deuterium gas to alloy said image sensor after said contact plugs have been formed and prior to deposition of a metal interconnect layer, wherein the deuterium gas has a partial pressure of less then one atmospheric pressure.

6. The method of claim 5 wherein said pixel array includes photosensitive elements chosen from the group of a photodiode, partially pinned photodiode, pinned photodiode, photogate, or photocapacitor.

7. The method of claim 5 wherein said deuterium alloy is performed in a deuterium and nitrogen atmosphere with deuterium being between 5% to 100% of the atmosphere and temperature between 300 to 900° C.

8. The method of claim 5 wherein said image sensor is a CCD or CMOS image sensor.

* * * * *